United States Patent
Aridome

(10) Patent No.: US 9,525,300 B2
(45) Date of Patent: Dec. 20, 2016

(54) ELECTRICITY STORAGE SYSTEM

(71) Applicant: Koji Aridome, Toyota (JP)

(72) Inventor: Koji Aridome, Toyota (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 104 days.

(21) Appl. No.: 14/434,601

(22) PCT Filed: Jan. 2, 2014

(86) PCT No.: PCT/IB2014/000003
§ 371 (c)(1),
(2) Date: Apr. 9, 2015

(87) PCT Pub. No.: WO2014/111784
PCT Pub. Date: Jul. 24, 2014

(65) Prior Publication Data
US 2015/0236525 A1    Aug. 20, 2015

(30) Foreign Application Priority Data

Jan. 18, 2013 (JP) ................................. 2013-007045

(51) Int. Cl.
*H02J 7/04* (2006.01)
*G01N 27/416* (2006.01)
(Continued)

(52) U.S. Cl.
CPC ............. *H02J 7/007* (2013.01); *G01R 31/362* (2013.01)

(58) Field of Classification Search
CPC ............. H02J 2007/0037; H02J 7/0077; G01R 31/3275
(Continued)

(56) References Cited

U.S. PATENT DOCUMENTS

| 2004/0008031 A1* | 1/2004 | Arai ..................... H01M 10/48 324/429 |
| 2008/0030169 A1* | 2/2008 | Kamishima .......... G01R 31/361 320/134 |

(Continued)

FOREIGN PATENT DOCUMENTS

| AU | 2010354957 A1 | 12/2012 |
| EP | 1 049 231 A1 | 11/2000 |

(Continued)

OTHER PUBLICATIONS

International Search Report and Written Opinion mailed Apr. 9, 2014 for corresponding International Patent Application No. PCT/IB2014/000003.

*Primary Examiner* — Richard Isla Rodas
*Assistant Examiner* — Michael Dibenedetto
(74) *Attorney, Agent, or Firm* — Sughrue Mion, PLLC

(57) ABSTRACT

An electricity storage system includes: an electricity storage unit (10, 11) that is subjected to charging and discharging; a voltage sensor (20, 20a) that detects a voltage value of the electricity storage unit; and a controller (30) that terminates the charging of the electricity storage unit when the detected voltage value reaches a charging termination voltage value. The controller calculates a voltage drop, which is associated with interruption of constant current charging, on the basis of the detected voltage value while the constant current charging is performed in the electricity storage unit, and sets the charging termination voltage value in accordance with the amount of voltage drop.

7 Claims, 8 Drawing Sheets

(51) Int. Cl.
*H02J 7/16*    (2006.01)
*H02J 7/00*    (2006.01)
*G01R 31/36*    (2006.01)

(58) Field of Classification Search
USPC ........ 320/128, 132, 137, 149–152, 157–159;
324/429, 430
See application file for complete search history.

(56) References Cited

U.S. PATENT DOCUMENTS

| | | | |
|---|---|---|---|
| 2009/0027056 A1* | 1/2009 | Huang ................ | B60L 11/1857 324/439 |
| 2010/0188054 A1* | 7/2010 | Asakura ............... | G01R 31/025 320/161 |
| 2013/0002190 A1* | 1/2013 | Ogura ................... | H01M 10/44 320/101 |
| 2014/0312915 A1* | 10/2014 | Mukaitani .......... | G01R 31/3624 324/434 |

FOREIGN PATENT DOCUMENTS

| | | |
|---|---|---|
| JP | 08-019192 A | 1/1996 |
| JP | 08-154307 A | 6/1996 |
| JP | 09-019073 A | 1/1997 |
| JP | 10-106631 A | 4/1998 |
| JP | 11-055866 A | 2/1999 |
| JP | 2002-142379 A | 5/2002 |
| WO | 2011/155017 A1 | 12/2011 |
| WO | 2012/032621 A1 | 3/2012 |

\* cited by examiner

ELECTRICITY STORAGE SYSTEM

BACKGROUND OF THE INVENTION

1. Field of the Invention

The invention relates to an electricity storage system capable of charging an electricity storage unit.

2. Description of Related Art

Japanese Patent Application Publication No. 08-154307 (JP 08-154307 A) describes charging a battery to a full state of charge (SOC) using an external charger. Here, during the external charging, a shift to constant voltage charging is performed while monitoring a charging current and a terminal voltage of the battery, and when charging has been performed for a predetermined amount of time following a reduction in the charging current, the battery is determined to have reached the full SOC.

While the external charging is underway, a voltage value (a closed circuit voltage (CCV)) of the battery increases above an open circuit voltage (OCV) in accordance with an internal resistance of the battery. When the external charging is completed, the CCV of the battery decreases so as to approach the OCV. An amount of voltage drop occurring at the end of the external charging depends on the internal resistance of the battery. As deterioration of the battery progresses, the internal resistance of the battery increases, and therefore, depending on the voltage drop, it may become difficult to charge the battery to the full SOC.

SUMMARY OF THE INVENTION

An aspect of the invention relates to an electricity storage system including: an electricity storage unit that is subjected to charging and discharging; a voltage sensor that detects a voltage value of the electricity storage unit; and a controller that terminates the charging of the electricity storage unit when the detected voltage value reaches a charging termination voltage value. The controller calculates an amount of voltage drop, which is associated with interruption of constant current charging, on the basis of the detected voltage value while the constant current charging is performed in the electricity storage unit, and sets the charging termination voltage value in accordance with the amount of voltage drop.

By interrupting the constant current charging, the voltage value of the electricity storage unit can be caused to decrease, and as a result, the amount of voltage drop can be calculated. The amount of voltage drop is dependent on an internal resistance and a current value of the electricity storage unit. By calculating the amount of voltage drop during the constant current charging, variation in the amount of voltage drop accompanying variation in the current value (a charging current) can be excluded. In other words, the amount of voltage drop can be made dependent on the internal resistance of the electricity storage unit.

By calculating the amount of voltage drop in the manner described above, an amount of voltage drop corresponding to deterioration (the internal resistance) of the electricity storage unit can be learned. By learning the amount of voltage drop, the voltage value following completion of the charging of the electricity storage unit can be learned. As a result, the voltage value of the electricity storage unit following completion of the charging can be aligned with a target voltage value. In other words, a SOC of the electricity storage unit can be aligned with a target SOC.

The amount of voltage drop that accompanies interruption of the constant current charging can be calculated using a difference between two average values to be described below. One of the average values can be calculated by detecting the voltage value of the electricity storage unit at a plurality of different timings before the constant current charging is interrupted, and averaging the detected voltage values. The other average value can be calculated by detecting the voltage value of the electricity storage unit at a plurality of different timings while the constant current charging is interrupted, and averaging the detected voltage values.

When variation occurs in the voltage value before the constant current charging is interrupted, the calculated amount of voltage drop varies in accordance with the voltage value. Similarly, when variation occurs in the voltage value while the constant current charging is interrupted, the calculated amount of voltage drop varies in accordance with the voltage value. Hence, by employing the average values described above, variation in the calculated amount of voltage drop can be suppressed.

To charge the electricity storage unit, constant voltage charging can be performed after performing the constant current charging. Here, the constant current charging can be terminated when the detected voltage value becomes higher than the charging termination voltage value. Further, the constant voltage charging can be terminated when the detected voltage value remains continuously higher than the charging termination voltage value.

A condition in which the detected voltage value remains continuously higher than the charging termination voltage value may be, for example, a condition in which time (continuous time) during which the detected voltage value remains higher than the charging termination voltage value exceeds a predetermined threshold (time). Further, a count value may be incremented every time the detected voltage value is confirmed to be higher than the charging termination voltage value, and it may be determined that the detected voltage value has remained continuously higher than the charging termination voltage value when the count value exceeds a predetermined threshold (a count value).

The charging termination voltage value may be set as follows. First, a ratio between a first reference voltage drop amount and the amount of voltage drop accompanying interruption of the constant current charging is calculated. Here, the first reference voltage drop amount varies in accordance with the current value and the voltage value of the electricity storage unit, and a correspondence relationship therebetween can be determined in advance using a reference electricity storage unit. A newly manufactured, electricity storage unit in which no deterioration has occurred may be used as the reference electricity storage unit.

By detecting the current value of the electricity storage unit using a current sensor and detecting a temperature of the electricity storage unit using a temperature sensor, the first reference voltage drop amount corresponding to the detected current value and temperature can be specified. Values detected before the constant current charging is interrupted are used as the current value and temperature from which the first reference voltage drop amount is specified.

Next, a correction value is calculated by multiplying the aforesaid ratio by a second reference voltage drop amount. Here, the second reference voltage drop amount varies in accordance with the current value and the voltage value of the electricity storage unit, and a correspondence relationship therebetween can be determined in advance using the reference electricity storage unit. Hence, by detecting the current value and the temperature of the electricity storage unit using the current sensor and the temperature sensor, respectively, the second reference voltage drop amount corresponding to detection results can be specified. Values detected when the constant current charging has been terminated are used as the current value and temperature by which the second reference voltage drop amount is specified.

The charging termination voltage value is determined by adding the aforesaid correction value to an OCV value upon termination of the charging of the electricity storage unit. Here, the OCV value serves as the target voltage value when charging of the electricity storage unit is terminated. When the electricity storage unit is next charged, charging can be performed on the electricity storage unit until the detected voltage value reaches the set charging termination voltage value. Thus, the voltage value of the electricity storage unit following termination of the charging can be aligned with the target voltage value.

The constant current charging can be interrupted when the detected current value is within an allowable range. When variation occurs in the detected current value, the first reference voltage drop amount cannot easily be specified. Hence, by interrupting the constant current charging when the detected current value is within the allowable range, the precision with which the first reference voltage drop amount is specified can be improved.

To specify the first reference voltage drop amount, first, the current value of the electricity storage unit is detected at a plurality of different timings before the constant current charging is interrupted. An average value of the current values is then calculated, the first reference voltage drop amount can be specified by the average value (current value). Even when the current value is included in the allowable range, variation may occur in the current value within the allowable range. Therefore, by calculating the average value of the current value, the precision with which the first reference voltage drop amount is specified can be improved.

The electricity storage unit may be installed in a vehicle. By converting electric energy output from the electricity storage unit into kinetic energy, the kinetic energy can be used to cause the vehicle to travel. A motor generator (MG) can be used to convert the electric energy into kinetic energy. Further, to charge the electricity storage unit, power can be supplied to the electricity storage unit from a power supply disposed outside of the vehicle.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
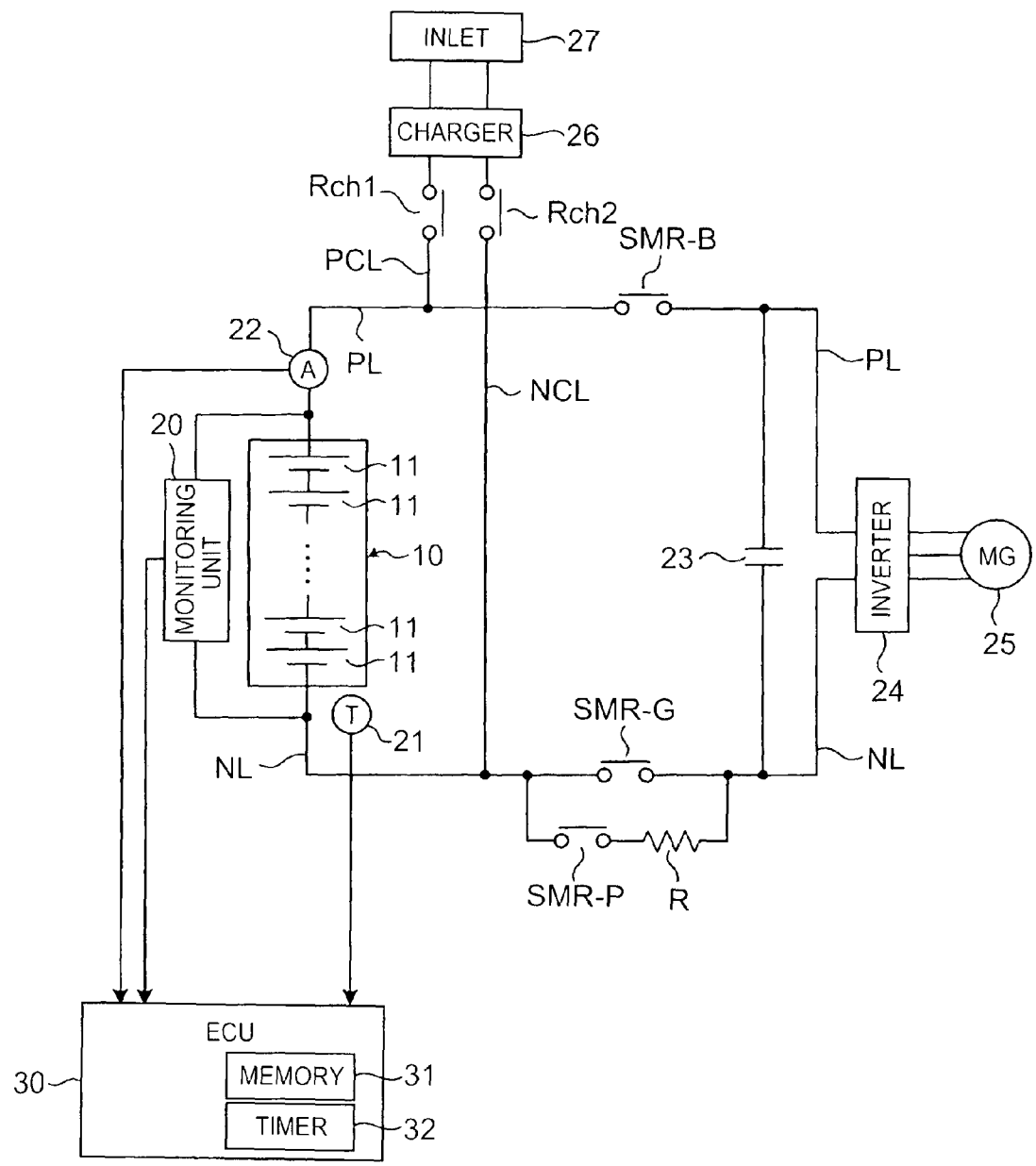
FIG. 1 is a view showing a configuration of a battery system.

FIG. 1 is a view showing a configuration of a battery system (which may be considered as an electricity storage system of the invention) according to an embodiment. The battery system shown in FIG. 1 is installed in a vehicle. The vehicle may be a plug-in hybrid vehicle (PHV) or an electric vehicle (EV), for example.

A PHV includes, as power sources that cause the vehicle to travel, a battery pack to be described below, and another power source such as an engine or a fuel cell. An EV includes only the battery pack to be described below as a power source that causes the vehicle to travel. As will be described below, in both the PHV and the EV, the battery pack can be charged using power from an external power supply.

Note that in this embodiment, the battery pack is installed in a vehicle, but the invention is not limited thereto, and may be applied to any system capable of charging . a battery pack.

A battery pack 10 includes a plurality of single cells 11 connected in series. A secondary battery such as a nickel hydrogen battery or a lithium ion battery may be used as the single cell 11. Further, an electric double layer capacitor may be used instead of a secondary battery. The number of single cells 11 may be set appropriately on the basis of a required output of the battery pack 10 and so. on. In the battery pack 10 according to this embodiment, all of the single cells 11 are connected in series, but the battery pack 10 may include a plurality of single cells 11 connected in parallel.

A monitoring unit (which may be considered as a voltage sensor of the invention) 20 detects a voltage by between terminals of the battery pack 10 and a voltage by between terminals of each single cell 11, and outputs detection results to an electronic control unit (ECU) 30. A specific configuration of the monitoring unit 20 will be described below. Here, the battery pack 10 and the single cell 11 may be considered as an electricity storage unit of the invention. A temperature sensor 21 detects a temperature of the battery pack 10 (the single cell 11) and outputs a detection result to the ECU 30. Here, one or a plurality of temperature sensors 21 may be disposed in relation to the battery pack 10.

A current sensor 22 detects a current value bib flowing through the battery pack 10, and outputs a detection result to the ECU 30. In this embodiment, the current value bib detected by the current sensor 22 takes a positive value when the battery pack 10 is being discharged. Further, the current value bib detected by the current sensor 22 takes a negative value when the battery pack 10 is being charged.

In this, embodiment, the current sensor 22 is provided on a positive electrode line PL connected to a positive electrode terminal of the battery pack 10. Here, as long as the current sensor 22 can detect the current flowing through the battery pack 10, a position in which the current sensor 22 is provided may be set appropriately. For example, the current sensor 22 may be provided on a negative electrode line NL connected to a negative electrode terminal of the battery pack 10. Further, a plurality of current sensors 22 may be used.

The ECU (which may be considered as a controller of the invention) 30 includes a memory 31, and the memory 31 stores various information used by the ECU 30 to perform predetermined processing (in particular processing described in this embodiment). The ECU 30 also includes a timer 32, and the timer 32 is used to measure time. In this embodiment, the memory 31 and the timer 32 are built into the ECU 30, but at least one of the memory 31 and the timer 32 may be provided on the exterior of the ECU 30.

A system main relay (SMR)-B is provided on the positive electrode line PL. The SMR-B is switched ON and OFF upon reception of a control signal from the ECU 30. A SMR-G is provided on the negative electrode line NL. The SMR-G is switched ON and OFF upon reception of a control signal from the ECU 30.

A SMR-P and a current limiting resistor R are connected in parallel to the SMR-G. Here, the SMR-P and the current limiting resistor R are connected in series. The SMR-P is switched ON and OFF upon reception of a control signal from the ECU 30.

The current limiting resistor R is used to prevent an inrush current from flowing to a capacitor 23 when the battery pack 10 is connected to a load (an inverter 24 to be described below). The capacitor 23 is connected to the positive electrode line PL and the negative electrode line NL and used to smooth voltage variation between the positive electrode line PL and the negative electrode line NL.

To connect the battery pack 10 to the inverter 24, first, the ECU 30 switches the SMR-B and SMR-P from OFF to ON. As a result, a current can be caused to flow to the current limiting resistor R, whereby an inrush current can be prevented from flowing to the capacitor 23. Next, the ECU 30 switches the SMR-G from OFF to ON and switches the SMR-P from ON to OFF.

Connection of the battery pack 10 to the inverter 24 is thus completed, whereby the battery system shown in FIG. 1 enters a Ready-On condition. Information relating to an ON/OFF condition of an ignition switch of the vehicle is input into the ECU 30, and the ECU 30 activates the battery system shown in FIG. 1 when the ignition switch is switched from OFF to ON.

When the ignition switch is switched from ON to OFF, on the other hand, the ECU 30 switches the SMR-B and SMR-G from ON to OFF. As a result, the connection between the battery pack 10 and the inverter 24 is interrupted, whereby the battery system shown in FIG. 1 enters a Ready-Off condition.

The inverter 24 converts direct current power output from the battery pack 10 into alternating current power, and outputs the alternating current power to a MG 25. A three-phase alternating current motor, for example, may be used as the MG 25. The MG 25 generates kinetic energy for causing the vehicle to travel upon reception of the alternating current power output from the inverter 24. The kinetic energy generated by the MG 25 is transmitted to a vehicle wheel, and as a result, the vehicle can be caused to travel.

When the vehicle is to be decelerated or stopped, the MG 25 converts kinetic energy generated during vehicle braking into electric energy (alternating current power). The inverter 24 converts the alternating current power generated by the MG 25 into direct current power, and outputs the direct current power to the battery pack 10. Thus, regenerative power can be stored in the battery pack 10.

In this embodiment, the battery pack 10 is connected to the inverter 24, but the invention is not limited thereto. More specifically, a booster circuit may be provided on a current path between the battery pack 10 and the inverter 24. The booster circuit boosts a voltage output by the battery pack 10 such that boosted power can be output to the inverter 24. The booster circuit also boosts a voltage output by the inverter 24 such that boosted power can be output to the battery pack 10.

A charger 26 is connected to the positive electrode line PL and the negative electrode line NL via charging lines PCL, NCL. More specifically, the charging line PCL is, connected to the positive electrode line PL connecting the positive electrode terminal of the battery pack 10 and the SMR-B. Further, the charging line NCL is connected to the negative electrode line NL connecting the negative electrode terminal of the battery pack 10 and the SMR-G.

Charging relays Rch1, Rch2 are provided on the charging lines PCL, NCL. The charging relays Rch1, Rch2 are switched ON and OFF upon reception of a control signal from the ECU 30. An inlet (a so-called connector) 27 is connected to the charger 26.

A plug (a so-called connector) connected to an external power supply (not shown) is connected to the inlet 27. By connecting the plug to the inlet 27, power from the external power supply can be supplied to the battery pack 10 via the charger 26. As a result, the battery pack 10 can be charged using the external power supply. A commercial power supply, for example, can be used as the external power supply. When the external power supply supplies alternating current power, the charger 26 converts the alternating current power from the external power supply into direct current power, and outputs the direct current power to the battery pack 10. The ECU 30 is capable of controlling an operation of the charger 26.

Charging the battery pack 10 by supplying power from the external power supply to the battery pack 10 will be referred to as external charging. In the battery system according to this embodiment, external charging can be performed when the charging relays Rch1, Rch2 are ON. During external charging, a constant charging current can be supplied to the battery pack 10, and therefore the battery pack 10 can be charged under a constant current.

The system for supplying power from the external power supply to the battery pack 10 is not limited to the system shown in FIG. 1. In this embodiment, the charger 26 is installed in the vehicle, but a charger (available as an external charger) may be disposed on the exterior of the vehicle. In this case, the charger 26 shown in FIG. 1 is omitted. By connecting a plug connected to the external charger to the inlet 27, power from the external power supply can be supplied to the battery pack 10.

Furthermore, in this embodiment, external charging is performed by connecting the plug to the inlet 27, but the invention is not limited thereto. More specifically, power from the external power supply may be supplied to the battery pack 10 using a so-called non-contact type charging system. In a non-contact type charging system, power can be supplied without being passed through a cable using electromagnetic induction or a resonance phenomenon. A conventional configuration may be employed appropriately as the non-contact type charging system.

Figure 2:
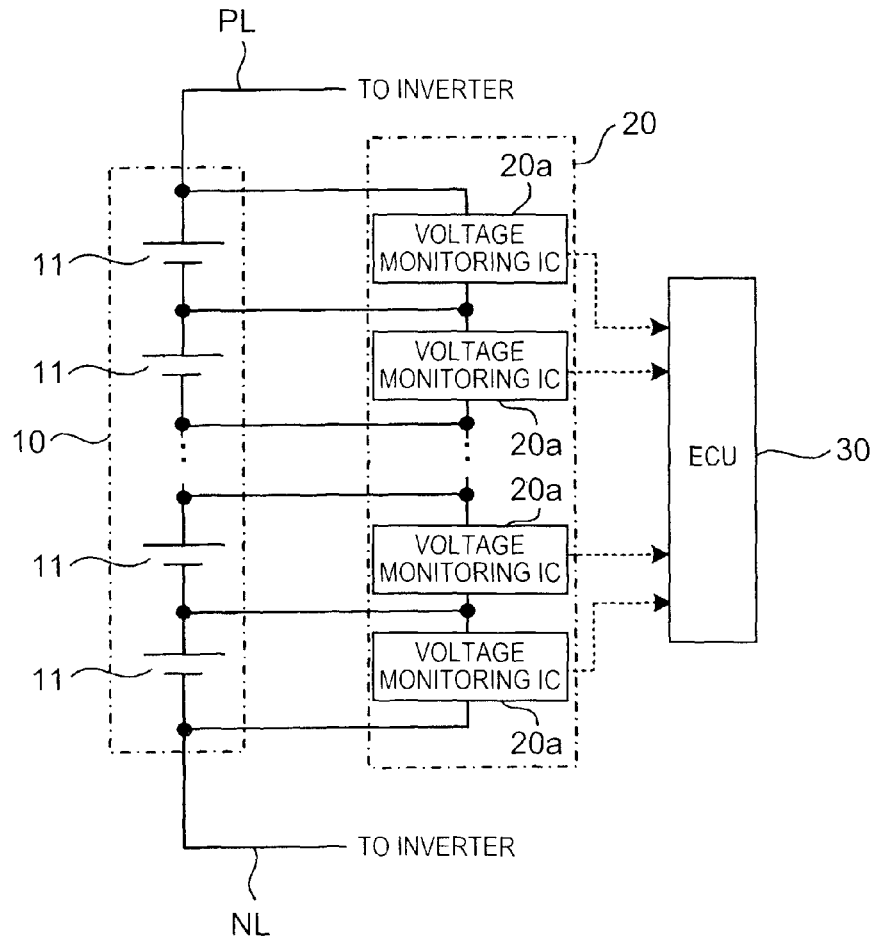
FIG. 2 is a view mainly showing a configuration of a monitoring unit.

Next, a configuration of the monitoring unit 20 will be described using FIG. 2. As shown in FIG. 2, the monitoring unit 20 includes voltage monitoring integrated circuits (ICs) 20a in an equal number to the number of single cells 11 constituting the battery pack 10. The voltage monitoring ICs 20a are connected in parallel to the respective single cells 11. The voltage monitoring IC 20*a* detects a voltage value of the corresponding single cell 11, and outputs a detection result to the ECU 30.

In this embodiment, the voltage monitoring IC 20*a* is provided for each single cell 11, but the invention is not limited thereto. For example, the plurality of single cells 11 constituting the battery pack 10 may be divided into a plurality of battery blocks, and the voltage monitoring IC 20*a* may be provided for each battery block. The battery block is constituted by a plurality of single cells 11 connected in series, and the battery pack 10 is constructed by connecting the plurality of battery blocks in series.

In this case, the voltage monitoring IC 20*a* detects the voltage value of the corresponding battery block, and outputs a detection result to the ECU 30. Note that each battery block may include a plurality of single cells 11 connected in parallel. Here, the battery block may be considered as the electricity storage unit of the invention.

In the battery system according to this embodiment, a SOC (SOC) of the battery pack 10 can be increased by performing external charging. Here, the SOC is a ratio of a current charging capacity to a full charging capacity. In a PHV and an EV, an EV travel distance can be secured more easily by increasing the SOC of the battery pack 10. The EV travel distance is a distance that can be traveled when the vehicle is caused to travel using only the output of the battery pack 10.

When external charging is performed, it is possible to set an SOC at which the external charging is to be terminated. For example, 100 [%], which corresponds to a full SOC, may be set as the SOC at which the external charging is to be terminated.

Here, a determination as to whether or not the SOC of the battery pack 10 has reached the set SOC value can be, made on the basis of the voltage value of the battery pack 10 or the single cell 11. By measuring the voltage value (to be referred to as a charging termination voltage value) at which the battery pack 10 or the single cell 11 reaches the set SOC value in advance, it is possible to determine that the battery pack 10 or the single cell 11 has reached the set SOC value when the voltage value of the battery pack 10 or the single cell 11 reaches the charging termination voltage value (a fixed value).

When deterioration of the single cell 11 progresses, an internal resistance of the single cell 11 increases. Here, as shown in Equation (1) below, a voltage value (a CCV) of the single cell 11 detected by the monitoring unit 20 (the voltage monitoring IC 20*a*) varies relative to a voltage value (an OCV) of the single cell 11 by an amount corresponding to a voltage variation amount that corresponds to the internal resistance. In other words, when the single cell 11 is charged, the CCV of the single cell 11 increases relative to the OCV of the single cell 11 by "Ib×Rb" (the voltage variation amount).

$$CCV = OCV + Ib \times Rb \quad (1)$$

In Equation (1), Ib is a current value flowing through the single cell 11, which is detected by the current sensor 22. Rb is the internal resistance of the single cell 11. The internal resistance Rb increases as deterioration of the single cell 11 progresses.

When external charging of the single cell 11 is terminated, the charging current stops flowing to the single cell 11, and therefore the voltage value of the single cell 11 approaches the OCV. In other words, when external charging is terminated, the voltage value of the single cell 11 decreases by "Ib×Rb". Here, an amount of voltage drop following termination of the external charging increases as the voltage variation amount (Ib×Rb) increases, or in other words as the current value Ib and the internal resistance Rb increase. Further, as will be described below, when the single cell 11 is subjected to constant current charging, the amount of voltage drop is dependent on the internal resistance Rb.

The determination as to whether or not the SOC of the single cell 11 has reached the set value is made on the basis of the CCV of the single cell 11, which is detected by the monitoring unit 20 (the voltage monitoring IC 20*a*). As described above, the voltage value of the single cell 11 decreases following termination of the external charging. Following termination of the external charging, therefore, the voltage value of the single cell 11 decreases below the charging termination voltage value (a fixed value) even after the CCV of the single cell 11 has reached the charging termination voltage value (a fixed value).

As a result, the battery pack 10 (the single cell 11) can no longer be charged until the SOC of the single cell 11 reaches the set value. When the SOC of the single cell 11 does not reach the set value, the aforesaid EV travel distance decreases by an amount corresponding to the resulting SOC difference.

In this embodiment, therefore, as will be described below, the charging termination voltage , value is corrected in consideration of the internal resistance (the deterioration condition) of the single cell 11. When the charging termination voltage value corrected in accordance with the internal resistance of the single cell 11 is used, the SOC of the single cell 11 reaches the set value more easily. By performing external charging with a high degree of precision until the SOC of the single cell 11 reaches the set value, an EV travel distance corresponding to the set value can be secured easily.

Figure 3:
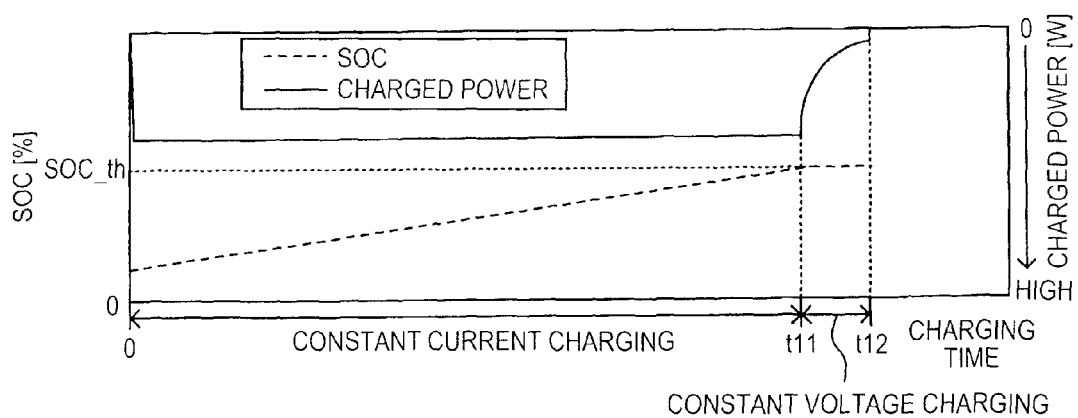
FIG. 3 is a view illustrating external charging processing performed on a battery pack.

First, processing performed when the battery pack 10 (the single cell 11) is subjected to external charging will be described using FIG. 3. In FIG. 3, a left side ordinate shows the SOC of the battery pack 10 or the single cell 11, and a right side ordinate shows a charged power. Further, an abscissa in FIG. 3 shows a duration of the external charging. The external charging progresses steadily toward the right side of FIG. 3.

Following the start of the external charging, the single cell 11 (the battery pack 10) is charged under a constant current. Here, the current value used during charging can be set appropriately. The duration of the constant current charging can be shortened by increasing the charging current value. When constant current charging is performed, the charged power remains constant, as shown in FIG. 3.

When the single cell 11 is charged, as described above using Equation (1), the CCV of the single cell 11 varies relative to the OCV by an amount corresponding to the voltage variation amount (Ib×Rb). When constant current charging is performed, the charging current value Ib remains constant, and therefore the voltage variation amount (Ib×Rb) varies in accordance with the internal resistance Rb of the single cell 11. In other words, in Equation (1), the internal resistance Rb of the single cell 11 can be learned from the voltage variation amount (Ib×Rb) included in the CCV.

As the constant current charging progresses, the SOC (in other words, the voltage value) of the single cell 11 increases. At a time t11 where the SOC of the single cell 11 reaches a threshold SOC_th, the constant current charging is terminated. Here, the threshold SOC_th corresponds to the set SOC value described above. After the constant current charging is terminated, the charging is switched to constant voltage charging. In other words, constant voltage charging is performed from the time t11 onward.

During the constant voltage charging, charging is performed such that the voltage value of the single cell 11 remains constant. Therefore, as shown in FIG. 3, the charging current decreases as the constant voltage charging progresses, leading to a reduction in the charged power. At a time t12 where the charged power varies to 0 [kW], the constant voltage charging is terminated. By performing constant voltage charging after performing constant current charging, as described above, the SOC of the single cell 11 can be caused to reach the threshold SOC_th.

Figure 4:
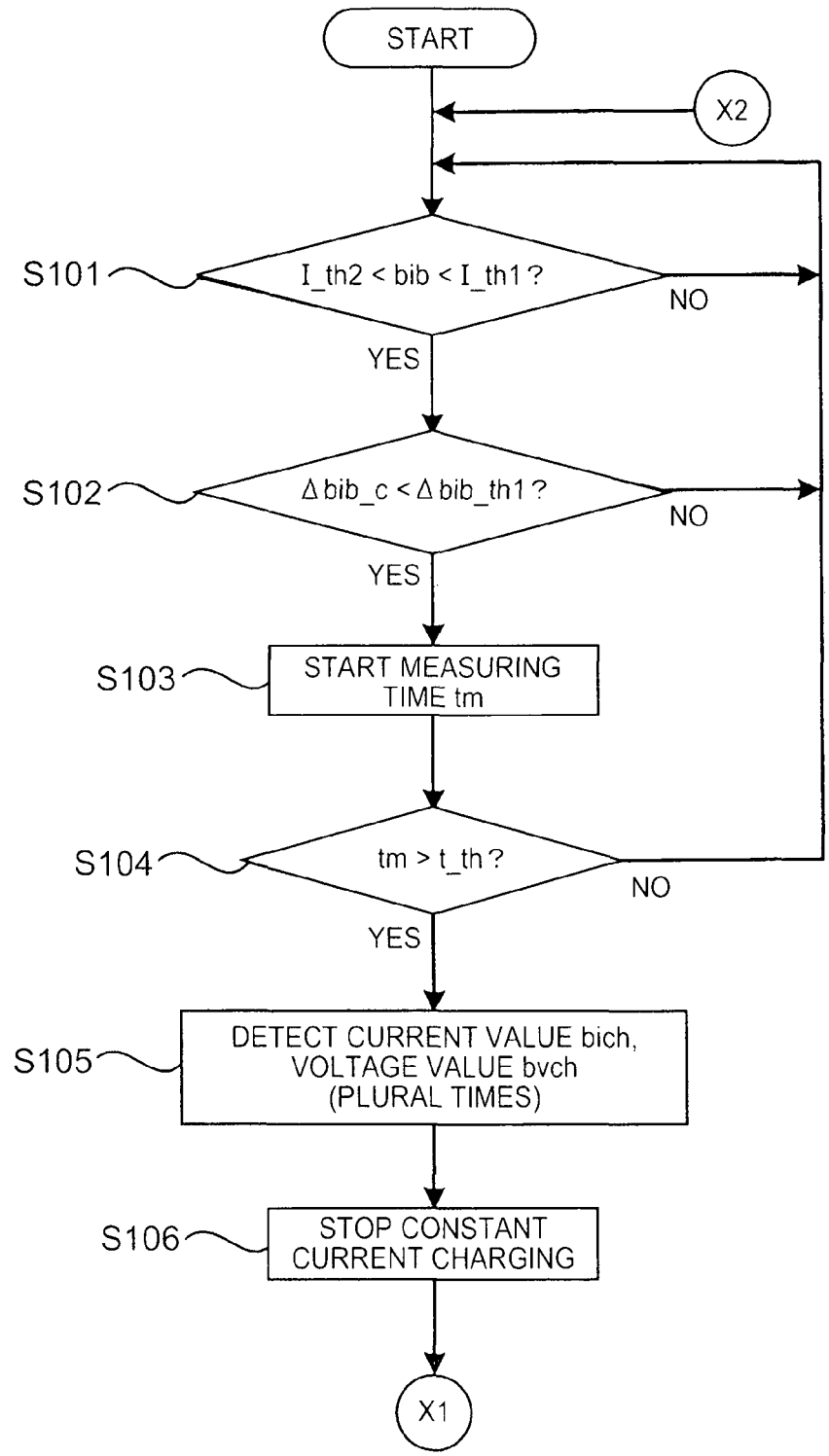
FIG. 4 is a flowchart illustrating constant current charging processing.
Figure 5:
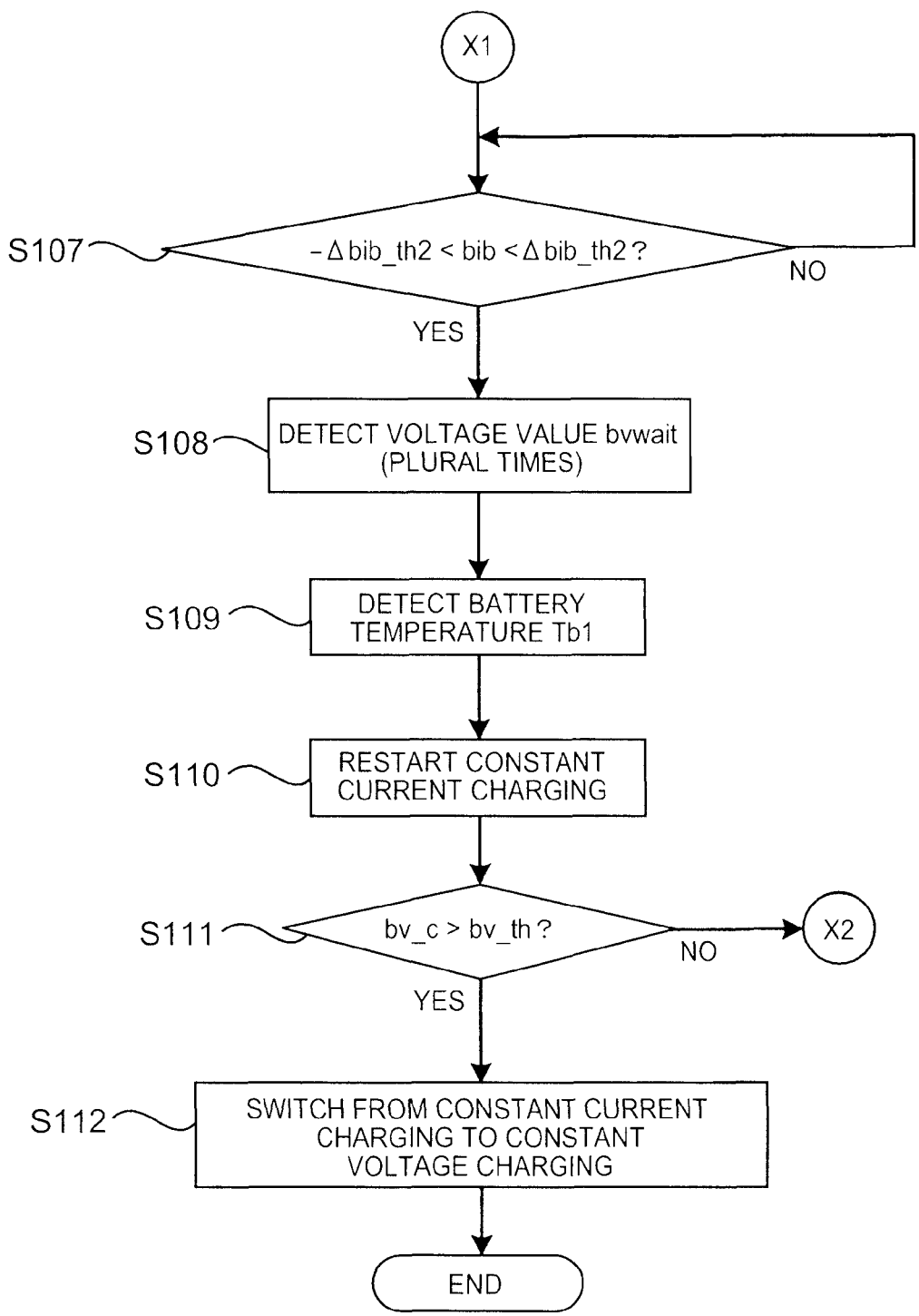
FIG. 5 is a flowchart illustrating the constant current charging processing.

Next, processing performed during the constant current charging will be described using flowcharts shown in FIGS. 4 and 5. Here, the processing shown in FIGS. 4 and 5 is executed by the ECU 30.

In step S101, the ECU 30 detects the current value bib of the battery pack 10 on the basis of the output of the current sensor 22. Further, the ECU 30 determines whether or not the current value bib is smaller than an upper limit threshold (a current value) I_th1 and larger than a lower limit threshold (a current value) I_th2. The thresholds I_th1, I_th2 are used to define an appropriate range of the current value during the external charging, and may be set appropriately. For example, the thresholds I_th1, I_th2 may be set appropriately with the aim of shortening the duration of the constant current charging. Information relating to the thresholds I_th1, I_th2 can be stored in advance in the memory 31.

In this embodiment, a determination is made as to whether, or not the current value bib is positioned between the upper limit threshold I_th1 and the lower limit threshold I_th2, but this processing (the processing of step S101) may be omitted. The ECU 30 then waits until the current value bib is positioned between the upper limit threshold I_th1 and the lower limit threshold I_th2. When the current value bib is positioned between the upper limit threshold I_th1 and the lower limit threshold I_th2, the ECU 30 performs processing of step S102.

In step S102, the ECU 30 calculates a variation amount Δbib_c in the current value bib. The current value bib may vary even during the constant current charging. Hence, when the current value bib varies, the ECU 30 specifies a maximum value bib_max and a minimum value bib_min on the basis of a variation history of the current value bib. The ECU 30 can then specify the variation amount Δbib_c by calculating a difference between the maximum value bib_max and the minimum value bib_min.

Further, in step S102, the ECU 30 determines whether or not the variation amount Δbib_c is smaller than a threshold (a variation amount) Δbib_th1. The threshold Δbib_t1 may be set appropriately, and information relating to the threshold Δbib_th1 can be stored in advance in the memory 31.

When the variation amount Δbib-c is smaller than the threshold Δbib-th1, the ECU 30 determines that variation in the current value bib is suppressed, and performs processing of step S103. When the variation amount Δbib-c is equal to or larger than the threshold Δbib-th1, on the other hand, the ECU 30 returns to the processing of step S101.

As will be described below, the current value bib is used to specify (estimate) the voltage variation amount. Here, when variation occurs in the current value bib, the voltage variation amount differs in accordance with the current value bib, and as a result, the voltage variation amount can no longer be estimated precisely. Hence, the processing of step S102 is performed to confirm that the variation amount Δbib_c is smaller than the threshold Δbib_th1, which serves as an allowable amount. In so doing, the precision with which the voltage variation amount is estimated can be improved when specifying (estimating) the voltage variation amount from the current value bib.

In step S103, the ECU 30 starts to measure time tm using the timer 32. Measurement of the time tm continues for as long as the variation amount Δbib_c remains smaller than the threshold Δbib_th1. In step S104, the ECU 30 determines whether or not the measured time tm exceeds a threshold (a time) t_th. The threshold t_th is used to determine whether or not variation in the current value bib remains suppressed, and is set appropriately. Information relating to the threshold t_th can be stored in advance in the memory 31.

When the measured time tm exceeds the threshold t_th, the ECU 30 determines that variation in the current value bib has converged, and performs processing of step S105. When the measured time tm is equal to or shorter than the threshold t_th, on the other hand, the ECU 30 returns to the processing of step S101.

In step S105, the ECU 30 detects a current value bich on the basis of the output of the current sensor 22. The current value bich is the current value bib detected when the measured time tm exceeds the threshold t_th. Further, the ECU 30 detects a voltage value (CCV) bvch of the battery pack 10 or the single cell 11 on the basis of the output of the monitoring unit 20 (the voltage monitoring IC 20*a*).

The voltage value bvch is the voltage value by detected when the measured time tm exceeds the threshold t_th. Here, the current value bich and the voltage value bvch are detected at identical timings a plurality of times at predetermined period intervals. The number of times the current value bich and the voltage value bvch are detected may be set appropriately.

When variation occurs among the voltage values of the plurality of single cells 11, an average value of the voltage values can be used as the voltage value bvch, for example. When no variation occurs among the voltage values of the plurality of single cells 11, on the other hand, the voltage value of an arbitrary single cell 11 can be used as the voltage value bvch.

Equalization processing may be employed as processing for reducing the variation among the voltage values of the plurality of single cells 11. In the equalization processing, a single cell 11 having a high voltage value is discharged to align the voltage value of the single cell 11 with the voltage values of the other single cells 11. After performing the equalization processing in this manner, no variation occurs among the voltage values of the plurality of single cells 11, and therefore the voltage value of an arbitrary single cell 11 can be used as the voltage value bvch. When the voltage value of the battery pack 10 is detected by the monitoring unit 20, on the other hand, the voltage value of the battery pack 10 can be used as the voltage value bvch.

The current value bich and the voltage value bvch detected in the processing of step S105 are stored in the memory 31. Note that in this embodiment, the current value bich and the voltage value bvch are detected a plurality of times, but may be detected once only.

Following completion of the processing for detecting the current value bich and the voltage value bvch, the ECU 30 stops the constant current charging in step S106. More specifically, the ECU 30 stops the power supply to the battery pack 10 from the external power supply by controlling the operation of the charger 26. When charging of the battery pack 10 is stopped, the voltage value of the battery pack 10 (the single cell 11) decreases, as described above using Equation (1).

In step S107, the ECU 30 detects the current value bib on the basis of the output of the current sensor 22. Further, the ECU 30 determines whether or not the detected current value bib is included in an allowable range. When the constant current charging is stopped in the processing of step S106, the charging current stops flowing to the battery pack 10, and therefore the current value bib reaches 0 [A].

Here, depending on a detection error by the current sensor 22 and so on, the current value bib detected by the current sensor 22 may deviate from 0 [A]. Hence, the processing of step S107 is performed to determine whether or not the current value bib is within the allowable range.

The allowable range is set using 0 [A] as a reference. More specifically, the allowable range is defined by a range that deviates by an allowable value (a current value) $\Delta bib\_th2$ from 0 [A] to a charging side and a range that deviates by the allowable value (a current value) $\Delta bib\_th2$ from 0 [A] to a discharging side. In other words, during the processing of step S107, the ECU 30 determines whether or not the current value bib is larger than an allowable lower limit value "$-\Delta bib\_th2$" and smaller than an allowable upper limit value "$+\Delta bib\_th2$".

The allowable value $\Delta bib\_th2$ may be set appropriately, and information relating to the allowable value $\Delta bib\_th2$ can be stored in the memory 31 in advance. In this embodiment, the charging side allowable value $\Delta bib\_th2$ and the discharging side allowable value $\Delta bib\_th2$ are equal to each other, but the invention is not limited thereto.

In other words, different allowable values may be used on the charging side and the discharging side. For example, the charging side and discharging side allowable values may be differentiated in consideration of a detection characteristic of the current sensor 22 and so on.

When the current value bib is included in the allowable range described above, the ECU 30 performs processing of step S108. When the current value bib is outside the allowable range, on the other hand, the ECU 30 waits until the current value bib enters the allowable range. In step S108, the ECU 30 detects a voltage value bvwait of the battery pack 10 or the single cell 11 on the basis of the output of the monitoring unit 20 (the voltage monitoring IC 20a). Here, the voltage value bywait is detected a plurality of times at predetermined period intervals. Note that the number of times (including a single time) the voltage value bvwait is detected may be set appropriately.

As described above in relation to the processing of step S105, when variation occurs among the voltage values of the plurality of single cells 11, the average value of the voltage values of the plurality of single cells 11 can be used as the voltage value bvwait. Further, when no variation occurs among the voltage values of the plurality of single cells 11, the voltage value of an arbitrary single cell 11 can be used as the voltage value bvwait. When the monitoring unit 20 detects the voltage value of the battery pack 10, on the other hand, the voltage value of the battery pack 10 can be used as the voltage value bvwait. Information relating to the detected voltage value bvwait is stored in the memory 31.

In step S109, the ECU 30 detects a temperature Tb1 of the battery pack 10 (the single cell 11) on the basis of the output of the temperature sensor 21. Here, when a plurality of temperature sensors 21 are used and the temperatures detected by the plurality of temperature sensors 21 are different from each other, any temperature can be used as the battery temperature Tb1. For example, the lowest temperature can be used as the battery temperature Tb1. Information relating to the battery temperature Tb1 is stored in the memory 31.

In step S110, the ECU 30 restarts the constant current charging. More specifically, the ECU 30 supplies power from the external power supply to the battery pack 10 by controlling the, operation of the charger 26. In step S111, the ECU 30 detects a voltage value (the CCV) bv_c of the battery pack 10 or the single cell 11 on the basis of the output of the monitoring unit 20. The ECU 30 then determines whether or not the detected voltage value bv_c is higher than a charging termination voltage value bv_th.

Here, when the voltage values of the plurality of single cells 11 are detected by the monitoring unit 20 (the voltage monitoring IC 20a), the voltage value of any single cell 11 can be used as the voltage value bv_c. For example, the voltage value of the single cell 11 having the highest voltage value can be used as the voltage value bv_c.

When variation occurs among the voltage values of the plurality of single cells 11, the average value of the voltage values of the plurality of single cells 11 can be used as the voltage value bv_c. Further, when no variation occurs among the voltage values of the plurality of single cells 11, the voltage value of an arbitrary single cell 11 can be used as the voltage value bv_c. The charging termination voltage value bv_th is set appropriately in accordance with the content of the voltage value bv_c (the voltage value of the battery pack 10 or the single cell 11).

When the voltage value bv_c is higher than the charging termination voltage value bv_th, the ECU 30 performs processing of step S112. When the voltage value bv_c is lower than the charging termination voltage value bv_th, on the other hand, the ECU 30 returns to the processing of step S101. In step S112, the ECU 30 terminates the constant current charging and switches the method of charging the battery pack 10 to constant voltage charging. As described above, the processing from step S101 to step S111 is performed repeatedly until the voltage value bv_c reaches the charging termination voltage value bv_th. In other words, the processing from step S101 to step S111 is performed at least once while the constant current charging is underway.

Figure 6:
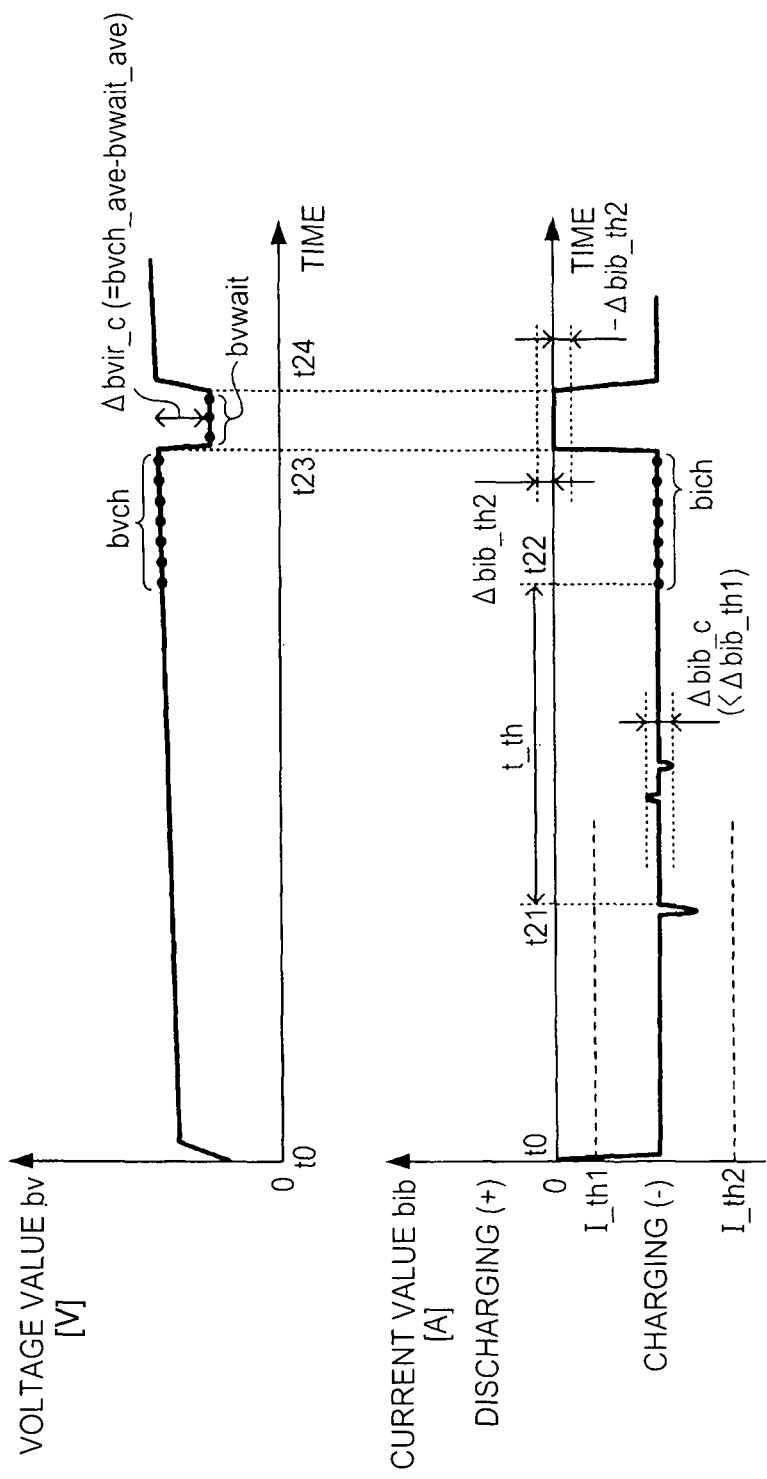
FIG. 6 is a view showing behavior of a voltage value and a current value during the constant current charging processing.

FIG. 6 shows behavior of the voltage value by and the current value bib during the constant current charging. In FIG. 6 an ordinate shows the voltage value by and the current value bib, and an abscissa shows time.

As shown in FIG. 6, when the external charging (constant current charging) starts from a time t0, the voltage value by increases. Here, when the voltage value by includes a ripple component, annealing processing may be implemented on the voltage value by. For example, a current annealed voltage value can be calculated by applying weighted addition to an average value of the currently detected voltage value by and a previous annealed voltage value.

By detecting the current value bib on the basis of the output of the current sensor 22, a determination can be made as to whether or not the current value bib is positioned between the upper limit threshold I_th1 and the lower limit threshold I_th2 (the processing of step S101 in FIG. 4). In the example of FIG. 6, the current value bib varies between the upper limit threshold I_th1 and the lower limit threshold I_th2.

While the constant current charging is underway, the current value bib may vary as shown in FIG. 6. Here, when the variation amount $\Delta bib\_c$ of the current value bib is smaller than the threshold $\Delta bib\_th1$, measurement of the time tm is started (the processing of steps S102 and S103 in FIG. 4). In the example of FIG. 6, measurement of the time tm is started at a time t21.

When the measured time tm reaches the threshold t_th, detection of the current value bich is started (the processing of steps S104 and S105 in FIG. 4). In the example of FIG. 6, detection of the current value bich is started at a time t22. From the time t22 onward, the current value bich is detected a plurality of times at predetermined period intervals. Here, the voltage value bvch is detected in synchronization with the detection timing of the current value bich (the processing of step S105 in FIG. 4).

When detection of the current value bich and the voltage value bvch is complete, the constant current charging is stopped at a time t23 (the processing of step S106 in FIG. 4). As a result, the current value bib falls to 0 [A]. Here, when the current value bib is within the allowable range defined by the allowable lower limit value "−Δbib_th2" and the allowable upper limit value "+Δbib_th2", detection of the voltage value bvwait is started (the processing of steps S107 and S108 in FIG. 5). More specifically, the voltage value bvwait is detected a plurality of times at predetermined period intervals.

When detection of the voltage value bvwait is complete, the constant current charging is restarted. In the example of FIG. 6, the constant current charging is restarted at a time t24. Accordingly, the current value bib varies between the upper limit threshold I_th1 and the lower limit threshold I_th2. After restarting the constant current charging, the processing described above is repeated until the voltage value bv_c reaches the charging termination voltage value bv_th.

Figure 7:
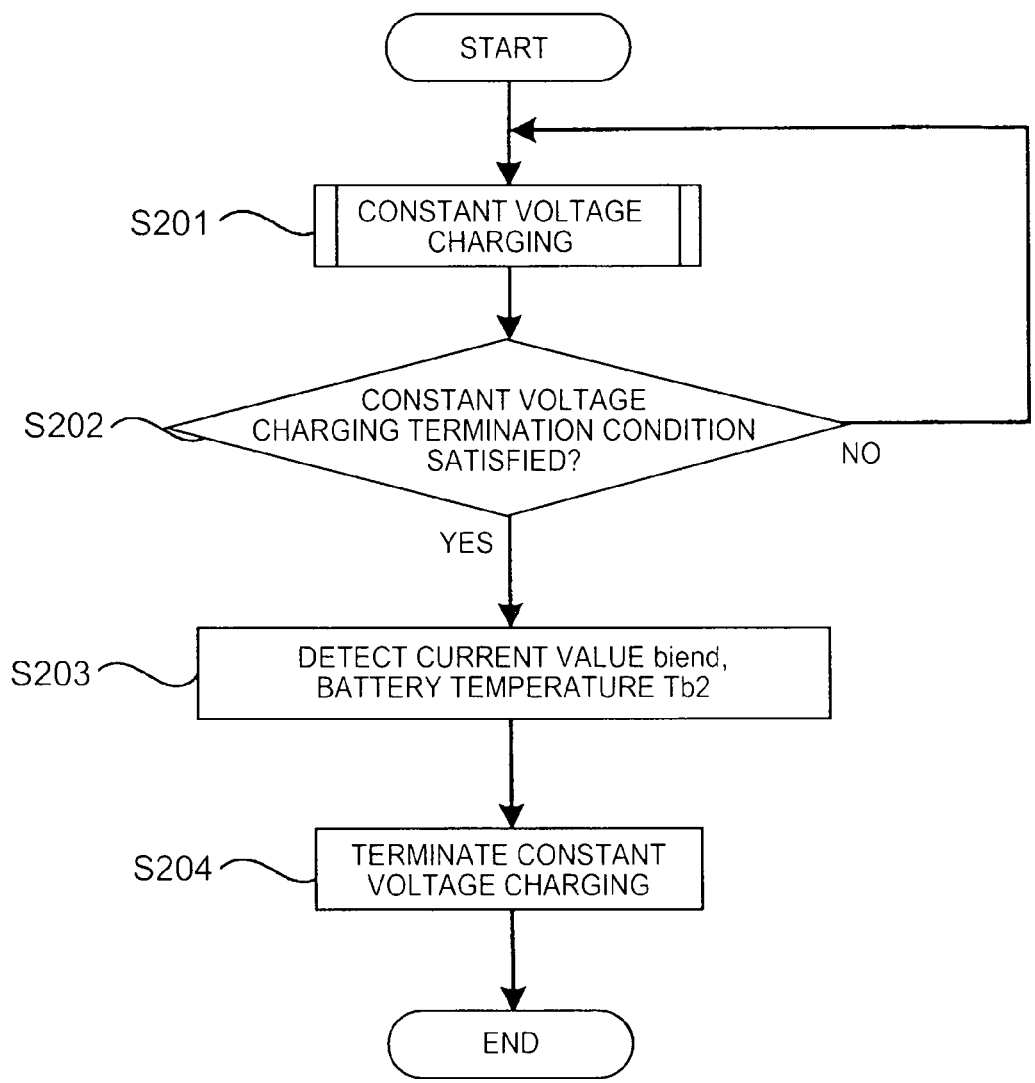
FIG. 7 is a flowchart illustrating constant voltage charging processing.

Next, processing performed during the constant voltage charging will be described using a flowchart shown in FIG. 7. The processing shown in FIG. 7 is performed following completion of the processing shown in FIG. 5. The processing shown in FIG. 7 is executed by the ECU 30.

In step S201, the ECU 30 performs external charging on the battery pack 10 under a constant voltage. As described above using FIG. 5, the constant current charging is switched to the constant voltage charging after the voltage value bv_c reaches the charging termination voltage value bv_th. During the constant voltage charging, external charging is performed on the battery pack 10 in a condition where the voltage value bv_c is maintained at the charging termination voltage value bv_th. Therefore, as described above using FIG. 3, the charged power decreases as the constant voltage charging progresses.

In, step S202, the ECU 30 determines whether or not a constant voltage charging termination condition is satisfied. Here, when the constant voltage charging termination condition is satisfied, the ECU 30 performs processing of step S203. When the constant voltage charging termination condition is not satisfied, on the other hand, the ECU 30 continues the processing of step S201.

A condition described below, for example, may be set as the constant voltage charging termination condition. First, while detecting the voltage value bv_c a plurality of times, the number of times the voltage value bv_c exceeds the charging termination voltage value bv_th is counted. When the count value exceeds a threshold, it may be determined that the constant voltage charging termination condition is satisfied.

By confirming that the count value is larger than the threshold, it can be determined that the voltage value bv_c is higher than the charging termination voltage value bv_th. Accordingly, the constant voltage charging can be terminated. Note that the threshold corresponding to the count value may be set appropriately, and information relating to the threshold can be stored in the memory 31 in advance.

The constant voltage charging termination condition is not, however, limited to the condition described above. In other words, any condition by which it is possible to confirm that the voltage value bv_c is continuously higher than the charging termination voltage value bv_th may be employed. For example, a time (a continuous time) during which the voltage value bv_c remains higher than the charging termination voltage value bv_th may be measured, and when the measured time exceeds a threshold, it may be determined that the constant voltage charging termination condition is satisfied. As described above, the voltage value of either the battery pack 10 or the single cell 11 may be used as the voltage value bv_c. When variation occurs among the voltage values of the plurality of single cells 11, the average value of the voltage values can be used as the voltage value bv_c.

In step S203, the ECU 30 detects a current value biend upon termination of the constant voltage charging on the basis of the output of the current sensor 22. The current value biend is the current value bib detected by the current sensor 22 at the end of the constant voltage charging. Further, in step S203, the ECU 30 detects a battery temperature Tb2 upon termination of the constant voltage charging on the basis of the output of the temperature sensor 21. Here, the ECU 30 stores information relating to the current value biend and the battery temperature Tb2 in the memory 31. In step S204, the ECU 30 terminates the constant voltage charging (the external charging).

Figure 8:
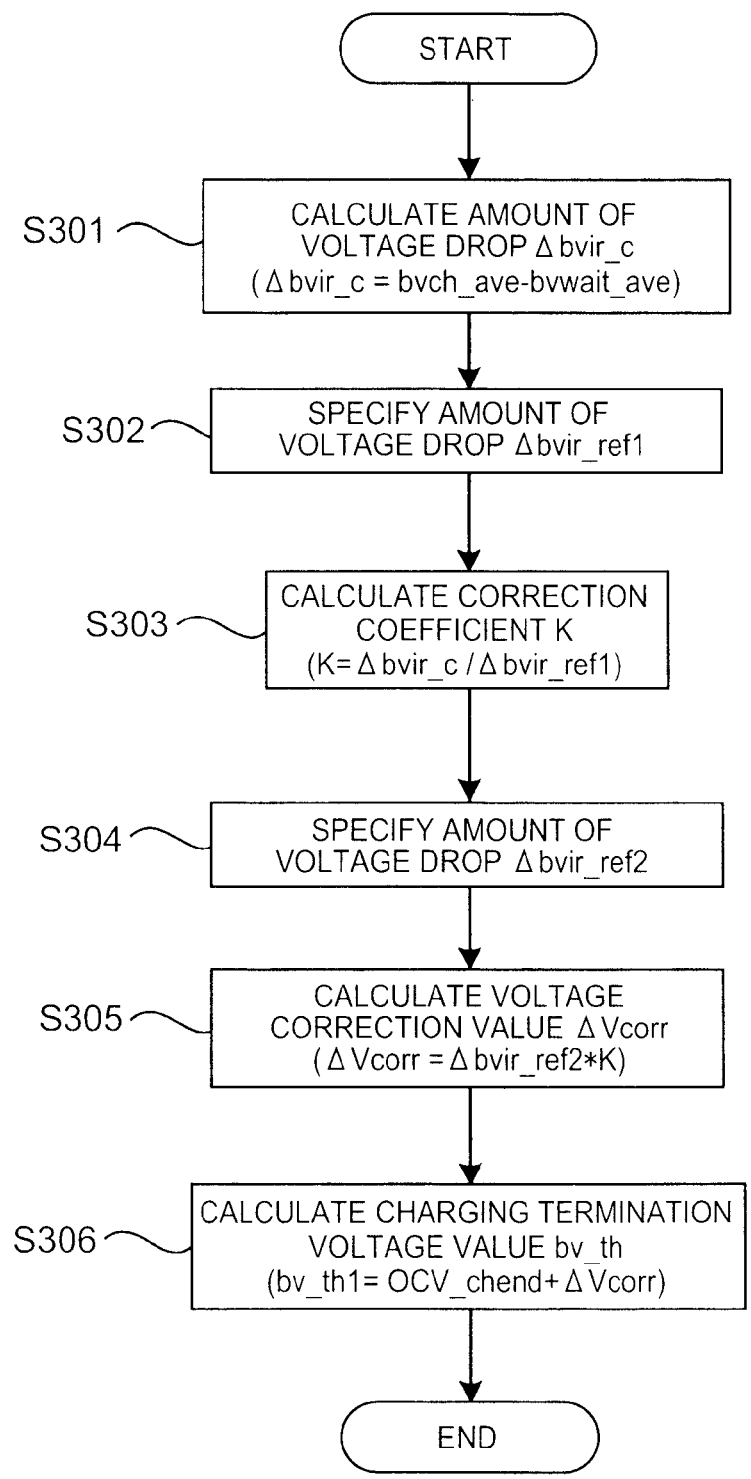
FIG. 8 is a flowchart illustrating processing for correcting a charging termination voltage value.

Next, processing for correcting the charging termination voltage value bv_th will be described using a flowchart shown in FIG. 8. Here, the processing shown in FIG. 8 is executed by the ECU 30.

In step S301, the ECU 30 calculates an amount of voltage drop Δbvir_c. Here, the amount of voltage drop Δbvir_c is an amount of voltage drop occurring when the constant current charging is stopped temporarily while the constant current charging is performed (the processing shown in FIGS. 4 and 5) (see FIG. 6). The constant current charging is stopped temporarily in the processing of step S106 shown in FIG. 4, and as a result of the charging stoppage, the voltage value of the battery pack 10 or the single cell 11 decreases.

The amount of voltage drop Δbvir_c can be calculated on the basis of Equation (2) shown below.

$$\Delta bvir\_c = bvch\_ave - bvwait\_ave \quad (2)$$

In Equation (2), a voltage value bvch ave is an average value of the plurality of voltage values bvch. As described in relation to the processing of step S105 in FIG. 4, the voltage value bvch is detected a plurality of times, and by averaging the plurality of voltage values bvch detected, the voltage value bvch_ave can be calculated. Note that when the voltage value bvch is detected only once, the detected voltage value bvch is used as the voltage value bvch ave of Equation (2).

In Equation (2), a voltage value bvwait ave is an average value of the plurality of voltage values bvwait. As described in relation to the processing of step S108 in FIG. 5, the voltage value bvwait is detected a plurality of times, and by averaging the plurality of voltage values bvwait thus detected, the voltage value bvwait_ave can be calculated. Note that when the voltage value bvwait is detected only once, the detected voltage value bvwait is used as the voltage value bvwait ave of Equation (2).

When variation occurs among the plurality of voltage values bvch or variation occurs among the plurality of voltage values bvwait, the amount of voltage drop Δbvir_c varies in accordance with the voltage values bvch, bvwait. Hence, by employing the average values (voltage values) bvch_ave, bvwait ave described above, variation in the amount of voltage drop Δbvir_c can be suppressed.

In step S302, the ECU 30 specifies (estimates) an amount of voltage drop Δbvir_ref1. The amount of voltage drop Δbvir_ref1 is an amount of voltage drop occurring when the constant current charging is stopped temporarily while is performed (the processing shown in FIGS. 4 and 5), and takes a value estimated on the basis of the battery temperature and the current value. Further, the amount of voltage drop Δbvir_ref1 may be considered as a first reference voltage drop amount of the invention.

Figure 9:
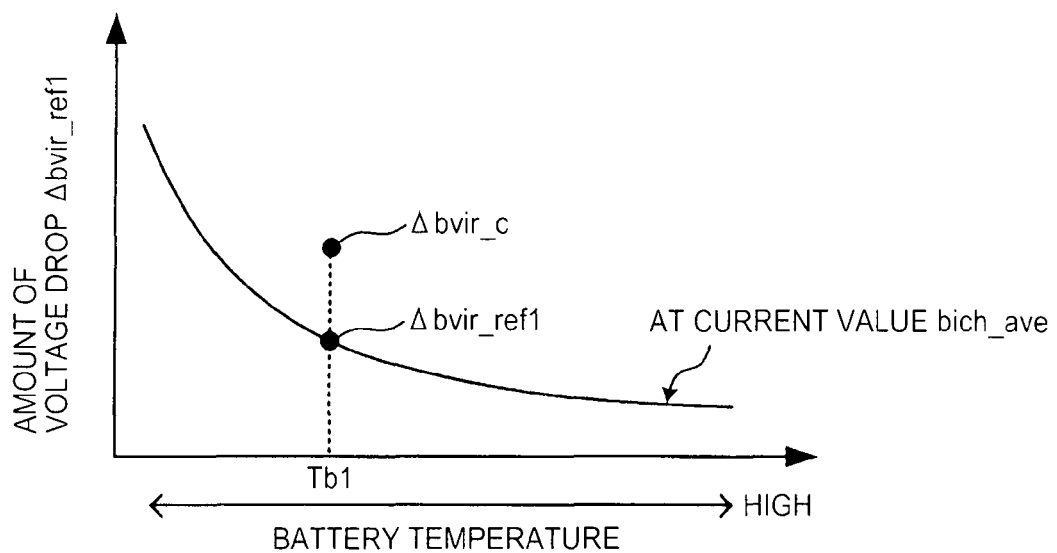
FIG. 9 is a view illustrating a relationship between an amount of voltage drop and a battery temperature during the constant current charging processing.

A correspondence relationship between the amount of voltage drop Δbvir_ref1 and the battery temperature and current value can be obtained in advance through experiment or the like. FIG. 9 is a map showing a correspondence relationship between the amount of voltage drop Δbvir_ref1 and the battery temperature when the current value takes a predetermined value. The map in FIG. 9 also shows a correspondence relationship obtained using a non-deteriorated single cell 11. A newly manufactured single cell 11, for example, may be used as the non-deteriorated single cell 11.

As shown in FIG. 9, the amount of voltage drop Δbvir_ref1 decreases as the battery temperature increases. In other words, the amount of voltage drop Δbvir_ref1 increases as the battery temperature decreases. As described above using Equation (1), the amount of voltage drop is defined by "Ib×Rb". Here, the internal resistance Rb of the single cell 11 increases as the battery temperature decreases. In other words, the internal resistance Rb of the single cell 11 decreases as the battery temperature increases. Hence, the battery temperature and the amount of voltage drop Δbvir_ref1 have the relationship shown in FIG. 9.

The correspondence relationship between the amount of voltage drop Δbvir_ref1 and the battery temperature shown in FIG. 9 varies according to the current value. The map shown in FIG. 9 can be stored (for each current value) in the memory 31 in advance. In the processing of step S302, first, the ECU 30 calculates a current value bich_ave. The current value bich_ave is an average value of the plurality of current values bich.

The current value bich is detected a plurality of times in the processing of step S105 shown in FIG. 4, and by averaging the current values bich thus obtained, the current value bich ave can be calculated. Note that when the current value bich is detected only once, the detected current value bich is used as the current value bich_ave.

After calculating the current value bich_ave, the ECU 30 specifies the map shown in FIG. 9 corresponding to the current value bich_ave. The ECU 30 then uses the specified map to specify the amount of voltage drop Δbvir_ref1 corresponding to the battery temperature Tb1. The battery temperature Tb1 is the temperature detected in the processing of step S109 shown in FIG. 5.

As described in relation to the processing shown in FIG. 4, the current value bich is the value detected when the variation amount Δbib_c falls below the threshold Δbib_th1. When the current value bich is detected a plurality of times, however, the current value bich may vary within the range of the threshold Δbib_th1. Therefore, by calculating the current value bich_ave and specifying the map corresponding to the current value bich ave, as described above, the map shown in FIG. 9 can be specified more easily.

In step S303, the ECU 30 calculates a correction coefficient K. The correction coefficient K can be calculated on the basis of Equation (3) shown below.

$$K = \frac{\Delta bvir\_c}{\Delta bvir\_ref1} \quad (3)$$

In Equation (3), Δbvir_c is the amount of voltage drop calculated in the processing of step S301. Further, Δbvir_ref1 is the amount of voltage drop specified (estimated) in the processing of step S302.

As deterioration of the single cell 11 progresses, the internal resistance of the single cell 11 increases, amount of voltage drop increases, as described above using Equation (1). Therefore, as shown in FIG. 9, the amount of voltage drop Δbvir_c may become larger than the amount of voltage drop Δbvir_ref1. As is evident from Equation (3), the correction coefficient K indicates an increase rate of the amount of voltage drop Δbvir_c relative to the amount of voltage drop Δbvir_ref1

Here, when the processing for stopping the constant current charging (the processing of step S106 in FIG. 4) is performed a plurality of times, a plurality of amounts of voltage drop Δbvir_c are calculated in the processing of step S301. Further, a plurality of amounts of voltage drop Δbvir_ref1 are specified in the processing of step S302. Accordingly, a plurality of correction coefficients K are calculated in the processing of step S303.

When a plurality of correction coefficients K are calculated, annealing processing may be performed every time the correction coefficient K is calculated. More specifically, an annealed correction coefficient K can be calculated by applying weighted addition to the current calculated correction coefficient K and a previous calculated correction coefficient K.

In step S304, the ECU 30 specifies (estimates) an amount of voltage drop Δbvir_ref2. The amount of voltage drop Δbvir_ref2 is an amount of voltage drop occurring when the constant voltage charging is terminated after performing the constant voltage charging (the processing shown in FIG. 7), and takes a value estimated on the basis of the battery temperature and the, current value. Further, the amount of voltage drop Δbvir_ref2 may be considered as a second reference voltage drop amount of the invention.

Figure 10:
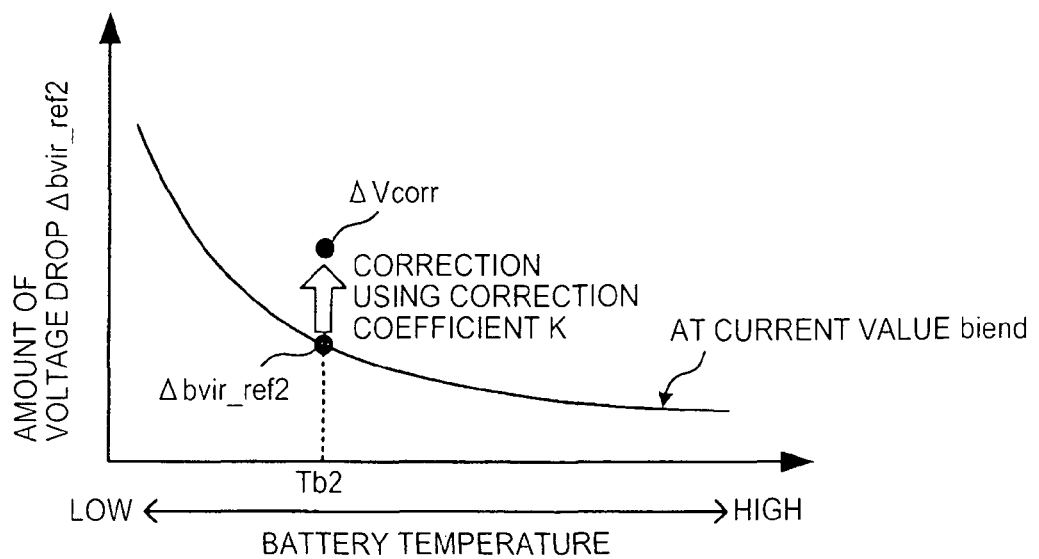
FIG. 10 is a view illustrating a relationship between the amount of voltage drop and the battery temperature during the constant voltage charging processing.

A correspondence relationship between the amount of voltage drop Δbvir_ref2 and the battery temperature and current value can be obtained in advance through experiment or the like. FIG. 10 is a map showing a correspondence relationship between the amount of voltage drop Δbvir_ref2 and the battery temperature when the current value takes a predetermined value. The map in FIG. 10 also shows a correspondence relationship obtained using the non-deteriorated single cell 11.

As shown in FIG. 10, the amount of voltage drop Δbvir_ref2 decreases as the battery temperature increases. In other words, the amount of voltage drop Δbvir_ref2 increases as the battery temperature decreases. As described above using FIG. 9, the internal resistance of the single cell 11 increases, leading to an increase in the amount of voltage drop Δbvir_ref2, as the battery temperature decreases.

The correspondence relationship between the amount of voltage drop Δbvir_ref2 and the battery temperature shown in FIG. 10 varies according to the current value. The map shown in FIG. 10 can be stored (for each current value) in the memory 31 in advance. In the processing of step S304, the ECU 30 specifies the map shown in FIG. 10 corresponding to the current value biend. Here, the current value biend is the current value detected in the processing of step S203 shown in FIG. 7.

The ECU 30 then uses the specified map to specify the amount of voltage drop Δbvir_ref2 corresponding to the battery temperature Tb2. Here, the battery temperature Tb2 is the temperature detected in the processing of step S203 shown in FIG. 7.

When a plurality of temperature sensors 21 are used, the highest battery temperature of the battery temperatures detected by the temperature sensors 21 can be used as the battery temperature Tb2. Here, when the lowest battery temperature is used as the battery temperature Tb2, a large amount of voltage drop Δbvir_ref2 is estimated when specifying the amount of voltage drop Δbvir_ref2 using the map shown in FIG. 10.

In this case, the charging termination voltage value by th calculated in processing of steps S305 and S306, to be described below, may become larger than a voltage value corresponding to the set SOC value. In other words, the battery pack 10 may be charged excessively. For this reason, the highest battery temperature can be used as the battery temperature Tb2. When the highest battery temperature is used as the battery temperature Tb2, excessive charging of the battery pack 10 can be suppressed.

In step S305, the ECU 30 calculates a voltage correction value (an amount of voltage drop) ΔVcorr. More specifically, the voltage correction value ΔVcorr is calculated on the basis of Equation (4) shown below.

$$\Delta Vcorr = \Delta bvir\_ref2 \times K \quad (4)$$

In Equation (4), Δbvir_ref2 is the amount of voltage drop specified (estimated) in the processing of step S304. Further, K is the correction coefficient calculated in the processing of step S303. As shown in FIG. 10, by employing the correction coefficient K, the present amount of voltage drop (the voltage correction value ΔVcorr) corresponding to the amount of voltage drop Δbvir_ref2 can be calculated.

In the non-deteriorated single cell 11, the voltage value of the single cell 11 decreases by an amount corresponding to the amount of voltage drop Δbvir_ref2 following termination of the constant voltage charging (the external charging). In a single cell 11 in which deterioration has progressed, on the other hand, the voltage value of the single cell 11 decreases by an amount corresponding to the amount of voltage drop (the voltage correction value) ΔVcorr following termination of the constant voltage charging (the external charging).

As described above, the correction coefficient K indicates a relationship between the amounts of voltage drop Δbvir_ref1 and Δbvir_c. By multiplying the correction coefficient K by the amount of voltage drop Δbvir_ref2, therefore, a present amount of voltage drop ΔVcorr of the single cell 11 can be specified using the amount of voltage drop Δbvir_ref2 as a reference.

In step S306, the ECU 30 calculates (corrects) the charging termination voltage value bv_th. More specifically, the charging termination voltage value bv_th is calculated on the basis of Equation (5) shown below.

$$bv\_th = OCV\_chend + \Delta Vcorr \quad (5)$$

In Equation (5), OCV chend is the OCV of the battery pack 10 or the single cell 11 upon termination of the constant voltage charging. OCV_chend varies in accordance with the set SOC value upon termination of the external charging. Here, the OCV and the SOC have a correspondence relationship, and therefore the OCV corresponding to the set SOC value can be specified by determining this correspondence relationship in advance. The specified OCV is set as OCV_chend.

In Equation (5), ΔVcorr is the voltage correction value (amount of voltage drop) calculated in the processing of step S305. The amount of voltage drop (the voltage correction value) ΔVcorr following termination of the constant voltage charging can be specified (estimated) by performing the processing of step S305. Hence, by employing a value obtained by adding the amount of voltage drop (the voltage correction value) ΔVcorr to OCV_chend as the charging termination voltage value bv_th, the voltage value of the battery pack 10 or the single cell 11 following termination of the constant voltage charging can be set as OCV_chend.

In other words, by terminating the external charging when the voltage value (CCV) by detected by the monitoring unit 20 reaches the charging termination voltage value bv_th while the external charging is underway, the voltage value of the battery pack 10 or the single cell 11 decreases by an amount corresponding to the amount of voltage drop (the voltage correction value) ΔVcorr. As a result, the voltage value of the battery pack 10 or the single cell 11 following termination of the external charging (the constant voltage charging) corresponds to OCV chend.

The charging termination voltage value bv_th calculated in the processing of step S306 is used in the processing of step S111 shown in FIG. 5 and the processing of step S202 shown in FIG. 7 during a following external charging operation. Here, the charging termination voltage value bv_th can be stored in the memory 31.

As described above, OCV_chend corresponds to the set SOC value upon termination of the external charging, and therefore the SOC of the battery pack 10 or the single cell 11 can be aligned with the set SOC value upon termination of the external charging (the constant voltage charging). In other words, the SOC of the battery pack 10 or the single cell 11 can be prevented from falling below the set SOC value. By causing the SOC of the battery pack 10 or the single cell 11 to reach the set SOC value, a reduction in the EV travel distance, for example, can be suppressed.

The invention claimed is:

1. An electricity storage system comprising:
   an electricity storage unit configured to be subjected to charging and discharging;
   a voltage sensor configured to detect a voltage value of the electricity storage unit;
   a current sensor configured to detect a current value of the electricity storage unit;
   a temperature sensor configured to detect a temperature of the electricity storage unit; and
   a controller configured to terminate the charging of the electricity storage unit when the detected voltage value reaches a charging termination voltage value,
   wherein the controller is configured to
   (a) calculate an amount of voltage drop, which is associated with interruption of constant current charging, on the basis of the detected voltage value while the constant current charging is performed in the electricity storage unit,
   (b) set the charging termination voltage value in accordance with the amount of voltage drop,
   (c) perform constant voltage charging after performing the constant current charging as the charging of the electricity storage unit,
   (d) calculate a ratio between a first reference voltage drop amount, which corresponds to the current value and the temperature before the constant current charging is interrupted, and the amount of voltage drop which is associated with the interruption of the constant current charging, (e) calculate a correction value by multiplying the ratio by a second reference voltage drop amount, which corresponds to the detected current value and the detected temperature upon termination of the constant voltage charging, and (f) set a value obtained by adding the correction value to an open circuit voltage value upon termination of the charging of the electricity storage unit as the charging termination voltage value.

2. The electricity storage system according to claim 1, wherein the controller calculates the amount of voltage drop by subtracting an average value of a plurality of detected voltage values obtained at different timings while the constant current charging is interrupted from an average value of a plurality of detected voltage values obtained at different timings before the constant current charging is interrupted.

3. The electricity storage system according to claim 2, wherein the controller terminates the constant current charging when the detected voltage value is higher than the charging termination voltage value, and terminates the constant voltage charging when the detected voltage value remains continuously higher than the charging termination voltage value.

4. The electricity storage system according to claim 1, wherein the controller interrupts the constant current charging when the detected current value is within an allowable range.

5. The electricity storage system according to claim 4, wherein the controller specifies the first reference voltage drop amount by using an average value of a plurality of detected current values obtained at different timings before the constant current charging is interrupted.

6. The electricity storage system according to claim 1, wherein the electricity storage unit is installed in a vehicle, and outputs electric energy that is converted into kinetic energy causing the vehicle to travel.

7. The electricity storage system according to claim 6, wherein the electricity storage unit is charged by a supply of electric power from a power supply disposed outside of the vehicle.

* * * * *